United States Patent
Choi et al.

[11] Patent Number: 6,097,639
[45] Date of Patent: *Aug. 1, 2000

[54] SYSTEM AND METHOD FOR PROGRAMMING NONVOLATILE MEMORY

[75] Inventors: Woong Lim Choi; Seok Ho Seo, both of Chungcheongbuk-do, Rep. of Korea

[73] Assignee: LG Semicon Co., Ltd., Chungcheongbuk-Do, Rep. of Korea

[*] Notice: This patent is subject to a terminal disclaimer.

[21] Appl. No.: 09/221,859

[22] Filed: Dec. 29, 1998

[30] Foreign Application Priority Data

Dec. 31, 1997 [KR] Rep. of Korea .................... 97-80701

[51] Int. Cl.[7] .................................................. G11C 16/04
[52] U.S. Cl. ........................ 365/185.28; 365/185.03; 365/185.22; 365/185.24
[58] Field of Search ................... 365/185.28, 185.03, 365/185.22, 185.24, 185.01

[56] References Cited

U.S. PATENT DOCUMENTS

| | | | |
|---|---|---|---|
| 5,043,940 | 8/1991 | Harari | 365/168 |
| 5,422,842 | 6/1995 | Gernea et al. | 365/185 |
| 5,434,825 | 7/1995 | Harari | 365/185 |
| 5,566,111 | 10/1996 | Choi | 365/185.22 |
| 5,583,812 | 12/1996 | Harari | 365/185.33 |
| 5,745,412 | 4/1998 | Choi | 365/185.1 |
| 5,764,572 | 6/1998 | Hammick | 365/189.01 |
| 5,801,993 | 9/1998 | Choi | 365/185.28 |
| 5,814,854 | 9/1998 | Liu et al. | 257/315 |
| 5,892,714 | 4/1999 | Choi | 365/185.22 |

*Primary Examiner*—David Nelms
*Assistant Examiner*—Hoai V. Ho
*Attorney, Agent, or Firm*—Morgan, Lewis & Bockius LLP

[57] ABSTRACT

A system for programming a nonvolatile memory includes a plurality of memory cells each having a field effect transistor with a control gate, a drain, a source, and a charge storage region, voltage sources for applying preset voltages pertinent to a threshold level to the source, the drain, and the control gate in each of the memory cells, a monitor for monitoring a current flowing through a channel in each of the memory cells, and a controller for stopping at least one of the voltages applied to the source, the drain, and the control gate in each of the memory cells when the monitor senses that the current flowing through the channel in the memory cell reaches a reference current.

37 Claims, 12 Drawing Sheets

SYSTEM AND METHOD FOR PROGRAMMING NONVOLATILE MEMORY

BACKGROUND OF THE INVENTION

1. Field of the Invention

The present invention relates to a nonvolatile memory, and more particularly, to system and method for programming a nonvolatile memory.

2. Discussion of the Related Art

Generally, in using nonvolatile semiconductor memory devices, such as EEPROM and flash EEPROM, for mass storage media, the most difficult-to-overcome drawback is that cost-per-bit of the memories is too expensive. In order to solve such a problem, studies on multibit-per-cell have been recently proposed. The packing density of a background art nonvolatile memory corresponds to the number of memory cells in one to one fashion. Meanwhile, the multibit-per-cell stores data of over two bits in one memory cell, enhancing the density of data on the same chip area, without reducing the size of the memory cell. For the multibit-per-cell, more than three threshold voltage levels should be programmed on the respective memory cells. For instance, in order to store data of over two bits for every cell, the respective cells must be programmed in $2^2$, that is, four, threshold levels. Here, the four threshold levels correspond to logic states 00, 01, 10, and 11, respectively.

In the multi-level program, the most critical problem is that the respective threshold voltage levels have a statistic distribution. The distribution value is about 0.5V. As the distribution is reduced more by precisely adjusting the respective threshold levels, more levels can be programmed, which in turn increases the number of bits for every cell. To reduce the voltage distribution, there is a method of performing programming by repeating programming and verification. According to this method, a series of program voltage pulses are applied to the cells in order to program the nonvolatile memory cell in intended threshold levels. To verify whether the cell reaches an intended threshold level, reading is performed between the respective voltage pulses. During verification, when the verified threshold level reaches the intended threshold level, programming stops. In the method of repeating programming and verification, it is hard to reduce the error distribution of the threshold level due to the limited pulse width of a program voltage. In addition, the algorithm of repeating programming and verification is implemented with a circuit, increasing the area of peripheral circuits of the chip. Furthermore, the repetitive method elongates the time to program. In order to solve such a drawback, R. Cernea of SunDisk Co., Ltd. suggested a method of performing programming and verifying simultaneously in U.S. Pat. No. 5,442,842 registered on Jun. 6, 1995.

FIG. 1a illustrates the symbol and circuit diagram of the nonvolatile memory (EEPROM) disclosed by Cernea, and FIG. 1b is a graph showing a programming principle of the nonvolatile memory of FIG. 1a.

Referring to FIG. 1a, the nonvolatile memory cell is composed of a control gate, floating gate, source, channel region, and drain. When a voltage sufficient to cause programming is applied to control gate and drain, currents flow between drain and source. When the thus flowing currents are compared with a reference current and reach a value equal to or smaller than the reference current, a programming completion signal is produced. According to this background art, verification is automatically performed at the same time of programming, compensating for the drawbacks of the repetitive method in which programming and verification are repeated. However, in the Cernea's method, the threshold voltage levels are not controlled by the voltages applied to respective electrodes on field effect transistors in the memory cell. And, in U.S. Pat. No. 5,043,940 registered on Aug. 27, 1991, multi-level programming has been performed in such a manner that the voltage applied to the respective ports of a memory cell is fixed, and reference currents corresponding to the respective levels are varied. In this method, as shown in FIG. 1b, reference currents for detection have no explicit relation with the cell threshold voltages, and are not linear therewith.

And, as shown in FIG. 2a, when the programming and erasing of the memory cell is repeated numerous times in the background art second method, a tunnel oxide film between the floating gate and the channel of the cell is physically degraded, with an increased charges trapped therein, that gradually reduces a program level. And, as shown in FIG. 2b, a probability density distribution of each threshold voltage corresponding to each multi-level also is not even, and becomes the more wider as the program times are increased, leading to a reduction of a reading allowance.

The aforementioned background art method for programming a nonvolatile memory has the following problems.

First, in the method of programming by repeating programming and verification, the degradation of the tunnel oxide film as a number of program/erasure is increased, with a gradual decrease of program level and a wider distribution of each threshold voltage corresponding to each multi-level which reduces a reading allowance, drops a program reliability.

Second, in the method of programing by varying a reference current corresponding to each level, since a direct and effective multi-level control is difficult, an effective programing is not possible.

SUMMARY OF THE INVENTION

Accordingly, the present invention is directed to system and method for programming a nonvolatile memory that substantially obviates one or more of the problems due to limitations and disadvantages of the related art.

An object of the present invention is to provide system and method for programming a nonvolatile memory which can control each level directly and effectively.

Another object of the present invention is to provide system and method for programming a nonvolatile memory which provides a uniform programmed state regardless of a number of repetition of programming and erasure, leading to have an improved program reliability.

Further object of the present invention is to provide system and method for programming a nonvolatile memory which can prevent an excessive erasure of cells.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the system for programming a nonvolatile memory includes a plurality of memory cells each having a field effect transistor with a control gate, a drain, and source, and charge storage means, means for applying preset voltages pertinent to a threshold level to the source, the drain, and the control gate in each of the memory cells, means for monitoring a current flowing through a channel in each of the memory cells, and means for stopping at least one of the voltages applied to the source, the drain, and the control gate in each of the memory cells when the means for monitoring a current senses that the current flowing through the channel in the memory cell reaches to a reference current.

In other aspect of the present invention, there is provided a programming method using a programming system for a nonvolatile memory, the nonvolatile memory including nonvolatile memory cells each having a source, a drain, a control gate, and a charge storage means connected to the source, the drain, and the control gate in static capacitance relations for controlling a current flowing in a channel between the source and the drain by means of a charge stored in the charge storage means, the programming method including the steps of applying voltages to the drain, the source, and the control gate, the voltages being pertinent to a preset threshold voltage and enough to cause a charge movement toward the charge storage means, monitoring the current flowing in the channel between the source and the drain, and stopping at least one of the voltages applied to the source, the drain, and the control gate when it is monitored that the current flowing in the channel reaches to a reference current corresponding to a preset threshold voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 1b is a graph for explaining a programming principle of the nonvolatile memory of FIG. 1a;

DETAILED DESCRIPTION OF THE PREFERRED EMBODIMENT

Figure 3:
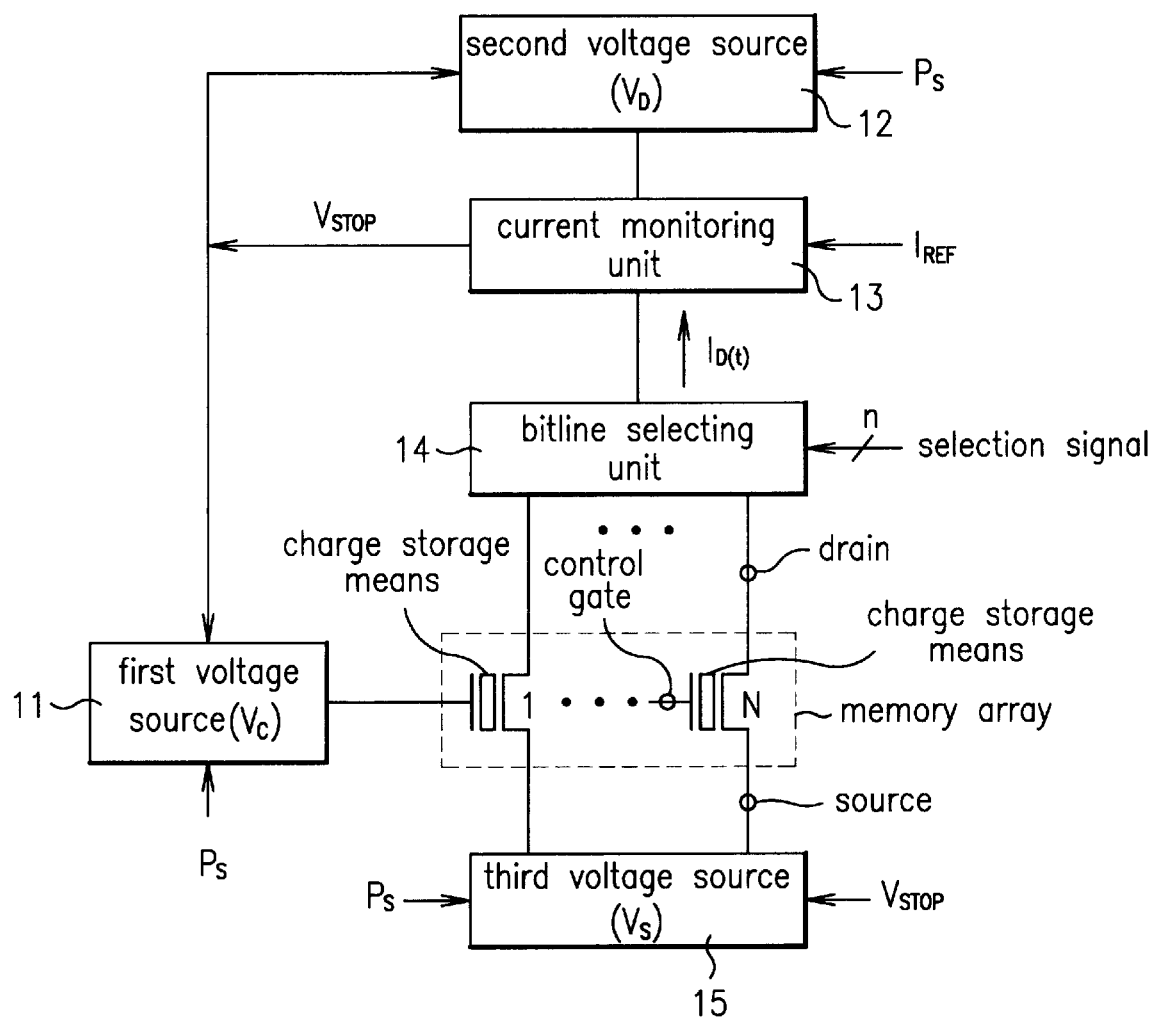
FIG. 3 illustrates a block diagram of an automatic verification and programming system for a nonvolatile memory in accordance with a first preferred embodiment of the present invention.

Reference will now be made in detail to the preferred embodiments of the present invention, examples of which are illustrated in the accompanying drawings. First, system and method for programming a nonvolatile memory in accordance with a first preferred embodiment of the present invention will be explained. FIG. 3 illustrates a block diagram of an automatic verification and programming system for a nonvolatile memory in accordance with a first preferred embodiment of the present invention.

Figure 1A:
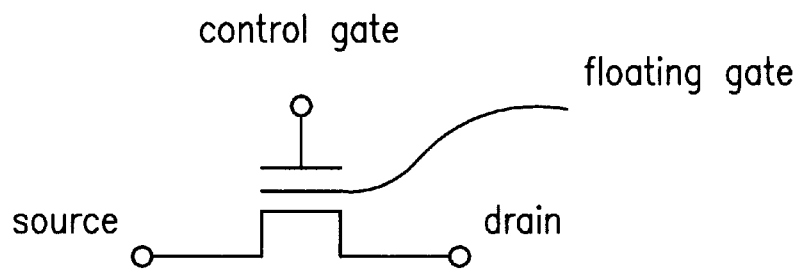
FIG. 1a is a circuit diagram of a nonvolatile memory cell in accordance with a first exemplary background art method.
Figure 1B:
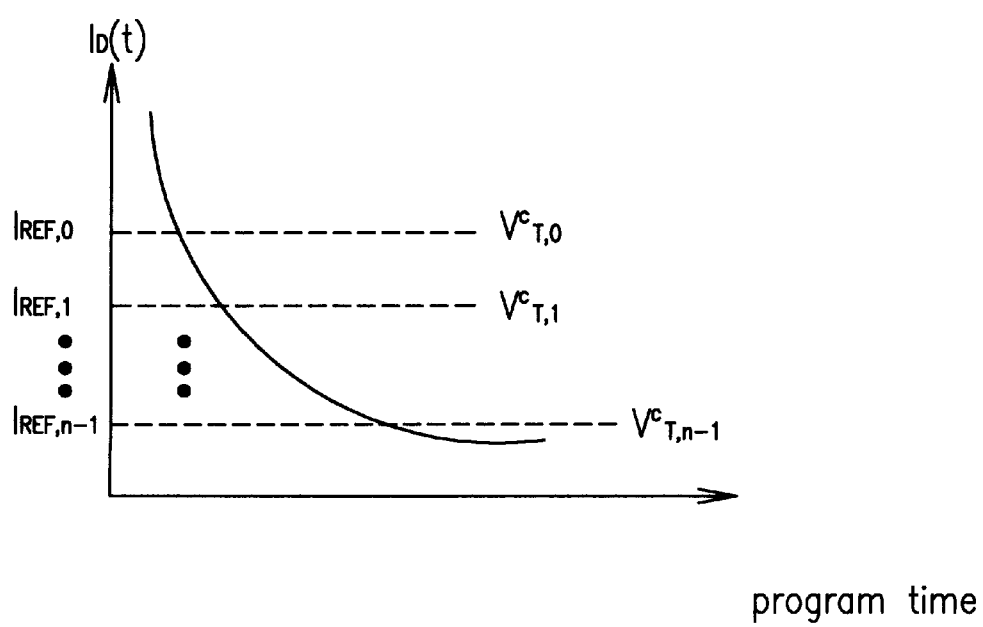

Referring to FIG. 3, the programming system for a nonvolatile memory in accordance with a first preferred embodiment of the present invention includes a plurality of memory cells each having a field effect transistor (FET) with a source, a drain, and a control gate, and charge storage means, a first voltage source 11 adapted to apply to the control gate, a third voltage source adapted to apply to the source, a second voltage source adapted to apply to the drain, a current monitoring unit 13 for monitoring a current flowing between the drain and the source, and a bitline selecting unit 14 for selecting a drain of a particular cell for programming. Each of the nonvolatile memory cell in FIG. 3 has a channel for flow of current between the source and the drain, and a rectangular bar present between the channel and the control gate is the charge storage means. The charge storage means has static capacitive relations with the source, drain, and control gate, with a charge level therein controlled by voltages applied to the source, drain, and the control gate. And, a channel conductivity and threshold voltage level dependent on the charge level in the charge storage means. The charge storage means may be a floating gate, an interface of oxygen and nitrogen, or a capacitor, and disposed at a position where the charge storage means can have a static capacitive relation with the drain, source, and control gate. And, in a case when means for monitoring a variation of the charge is a conductivity of the channel, the charge storage means should present to at least a portion of the channel. If the means for monitoring variation of the charge level stored in the charge storage means is directly or indirectly connected to the charge storage means for monitoring a voltage of the charge storage means, the charge storage means may not be present to a portion of the channel. And, when the charge storage means of the nonvolatile memory cell of FIG. 3 is a floating gate, the charge storage means has a symbol as shown in FIG. 1a. The Ps applied to the first, second, and third voltage sources 11, 12 and 15 denotes a programming start signal fed externally, and the Vstop is a programming stop signal.

It is assumed that the charge storage means in all the nonvolatile memory cells have been erased by an ultra-violet ray or electrical means before starting a programming using the programming system for a nonvolatile memory shown in FIG. 3. In this instance, states of erasure of each nonvolatile memory cell in general differ depending on fabrication process conditions of the cells, electrical intensity in the erasure, and changes in electrical and physical properties of the cell due to repetitive programming and erasure of the cells. For convenience of explanation, it is assumed that the FET in each cell has a p type substrate and an n type channel, the charge storage means in each cell is present between the control gate and the channel, and the current through the channel is dependent on an amount of charge in the charge storage means. And, the bitline selecting unit 14 connects a drain of a particular cell to be programmed to the current monitoring unit 13. Instead of the bitline selecting unit 14, a wordline selecting unit may be provided that selects a control gate in selecting a particular memory cell.

Figure 4:
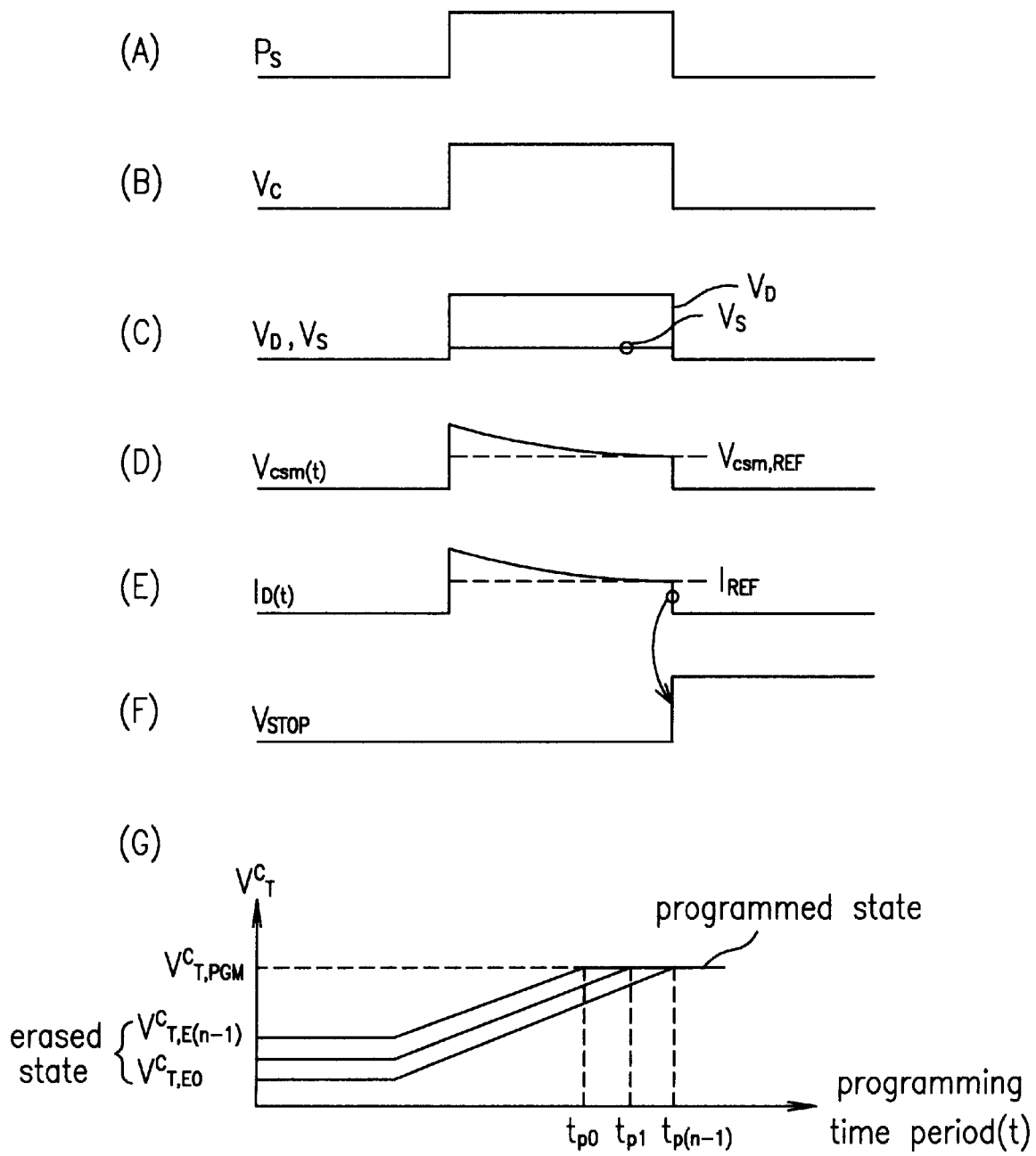
FIGS. 4a~4g illustrate waveforms at each node in FIG. 3.
Figure 5:
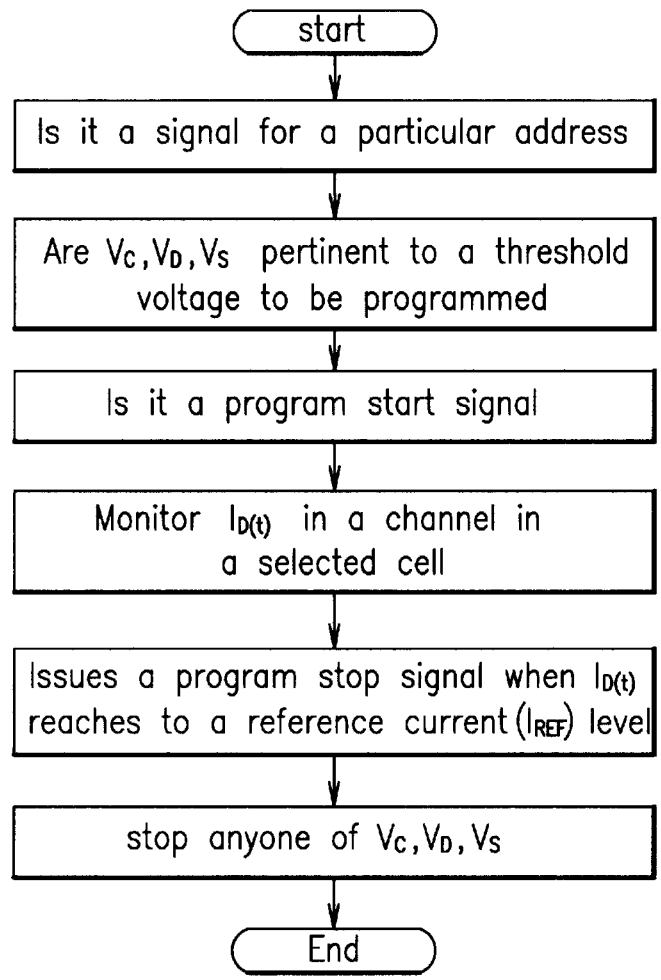
FIG. 5 illustrates a flow chart showing a single level programming process in accordance with a first preferred embodiment of the present invention.

A method for programming a nonvolatile memory using the system for programming the same will be explained. FIGS. 4a~4g illustrate waveforms at each node in FIG. 3, and FIG. 5 illustrates a flow chart showing a single level programming process in accordance with a first preferred embodiment of the present invention.

Referring to FIGS. 3, 4a~4g, and 5, a signal corresponding to an address of a particular cell is applied to the bitline selecting unit 14 for selecting the particular cell to be programmed. Then, as shown in FIG. 4a, a programming start signal Ps is applied to the first, second, and third voltage sources 11, 12, and 15. Voltages of Vc, $V_D$, and Vs as shown in FIGS. 4b and 4c are applied to the first, second, and third voltage sources 11, 12, and 15 respectively so that the first, second, and third voltage sources 11, 12, and 15 connected to the control gate, drain, and source of the selected particular cell can correspond to threshold levels to be programmed in response to the programming start signal Ps. Upon application of the voltages of Vc, $V_D$, and Vs, programming of the selected cell is started, and an inversion region is formed between the drain and source of the selected cell, with a current started to flow therebetween. A programming of a cell implies a movement of charge from/to the charge storage means to change an amount of charge stored in the charge storage means. In this explanation, it is assumed that a programming is a movement of electrons, negative charges, toward the charge storage means, by channel hot carrier injection or tunneling. Vcsm(t) in FIG. 4d denotes changes of a voltage in the charge storage means along time, and Vcsm, $_{REF}$ denotes a voltage of the charge storage means at which a programming stop signal is issued. As shown in FIG. 4d, when an electron is injected into the charge storage means of the selected cell, a voltage Vcsm of the charge storage means of the selected cell is dropped, causing a drop of current flowing, through the channel. And, the current monitoring unit 13 keeps monitoring the current $I_D(t)$ flowing through the channel of the selected cell until the current $I_D(t)$ reaches to a reference current $I_{REF}$ when the current monitoring unit 13 issues a program stop signal Vstop, to stop at least one of the voltages applied to the drain, source, and control gate of the selected cell. Thereafter, the same operation is repeated for each cell. As shown in FIG. 4g, it can be known that all the cells with threshold voltages different from one another initially become to have threshold voltages programmed to be the same by the aforementioned operation. Thus, by applying the programing method of the present invention to cells with a wide distribution of threshold voltages in an erasure state due to electrical or physical reasons, the cells can have the same threshold voltage levels, irrespective of the initial threshold voltage levels.

Figure 6:
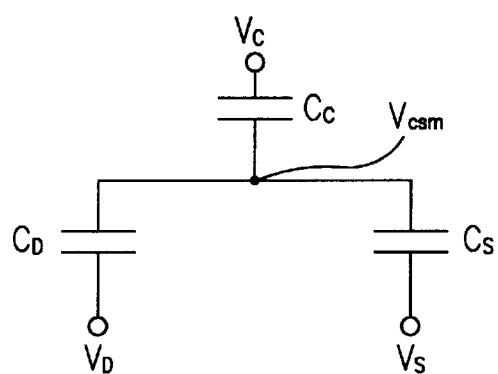
FIG. 6 illustrates a capacitance equivalent circuit of a memory cell with charge storage means.

Relations of the voltages $V_D$, Vs, and Vc applied to the drain, source, and control gate respectively with the threshold voltage before and after a programming will be explained with reference to FIG. 6. FIG. 6 illustrates a capacitance equivalent circuit of a memory cell with charge storage means.

Referring to FIG. 6, Cc denotes a capacitance between the control gate and the charge storage means, $C_D$ denotes a capacitance between the drain and charge storage means, and Cs denotes a capacitance between the source(inclusive of the substrate) and the charge storage means. A sum $C_T$ of the capacitances may be expressed as below.

$$C_T = Cc + C_D + Cs \quad (1)$$

A coupling coefficient of each capacitance is defined as expressed in equation (2) below.

$$\alpha c = Cc/C_T, \ \alpha_D + C_T, \ \alpha s = Cs/C_T \quad (2)$$

And, in general, a voltage in the charge storage means during a programming is expressed in equation (3) below.

$$Vcsm(t) = \alpha cVc + \alpha_D V_D + \alpha s Vs + Qcsm(t)/C_T \quad (3),$$

where, Qscm denotes an amount of charge erased excessively by an ultra-violet ray with reference to a neutral state of the charge storage means in a 't' time period. And, when we define a threshold voltage shift from the threshold voltage of the charge storage means in the neutral state caused by a stored charge measured from the control gate is $\Delta V_{T,UV}$, $\Delta V_{T,UV} = -Qcsm(t)/Cc$. And, the equation (3) may be rewritten in terms of $\Delta V_{T,UV}$ as shown in equation (4), below.

$$\Delta V_{T,UV}(t) = Vc + [\alpha_D V_D + \alpha s Vs - Vcsm(t)]/\alpha c \quad (4)$$

That is, $\Delta V_{T,UV}(t)$ in equation (4) represents a shift of the threshold voltage measured from the control gate at time t. The shift of the threshold voltage is a threshold voltage measured from the control gate caused by charges accumulated in the charge storage means. The shift of the threshold voltage is proportional to an amount of electrons stored in the charge storage means for a fixed bias voltage.

And, $Vcsm(t_{PGM})$, being a voltage of the charge storage means at a time of $t_{PGM}$ at which the programming stops, is defined as $V^{csm}{}_{REF}$, a shift of the threshold voltage caused by the $V^{csm}{}_{REF}$ monitored from the control gate can be expressed as equation (5), below.

$$\Delta V_{T,UV} = Vc + [\alpha_D V_D + \alpha_S V_S - V^{csm}{}_{REF}]/\alpha c \quad (5)$$

And, a current $I_D$ flowing through a channel of the FET can be expressed as an equation (6) for all operation regions inclusive of a saturation state and a triode state.

$$I_D = f(Vcsm - V^{csm}{}_T) \quad (6)$$

Equation (6) represents a function of a difference of a voltage Vcsm in the charge storage means and the threshold voltage $V^{csm}{}_T$ monitored at the charge storage means. In equation (6), the function 'f', in general, corresponds to $I_D$ and $(Vcsm - V^{csm}{}_T)$ in one to one fashion regardless of the function 'f' being a simple increasing function (having a relation of linear input/output) or not. Alike in equation (5), in equation (6), when we define a voltage of the charge storage means at the program stop is $Vcsm = V^{csm}{}_{REF}$, and a current at this time is $I_D = I_{REF}$, a voltage $V^{csm}{}_{REF}$ of the charge storage means after programming can be expressed as an equation (7) based on equation (6), below.

$$V^{csm}{}_{REF} = V^{csm}{}_T + f^{-1}(I_{REF}) \quad (7)$$

The threshold voltage from the control gate can be in general expressed as a sum of a threshold voltage $V^{csm}{}_T/\alpha c$ in the neutral state of the charge storage means and a threshold voltage shifted by the charge stored in the charge storage means as shown in an equation (8) below.

$$V_T = V^{csm}{}_T/\alpha c + \Delta V_{T,UV} \quad (8)$$

In this instance, the threshold voltage $V^{csm}{}_T$ in the neutral state of the charge storage means is inclusive of a threshold voltage shifted by a channel ion injection. Accordingly, the equation (8) can be rewritten using the equations (7) and (5) into equation (9) in terms of the threshold voltage measured from the control gate, as follows.

$$V_T = Vc + [\alpha_D V_D + \alpha_S V_S - f^{-1}(I_{REF})]/\alpha c \quad (9)$$

From the equation (9), it can be known that the threshold voltage monitored from the control gate has no relation with the threshold voltage $V^{csm}{}_T/\alpha c$ in the neutral state of the charge storage means. An initial threshold voltage of the charge storage means, being a fabrication process based variable fixed in an FET fabrication process, is dependent on such major factors as a doping concentration of the channel, and a material and a thickness of the insulator between the charge storage means and the channel.

Figure 7A:
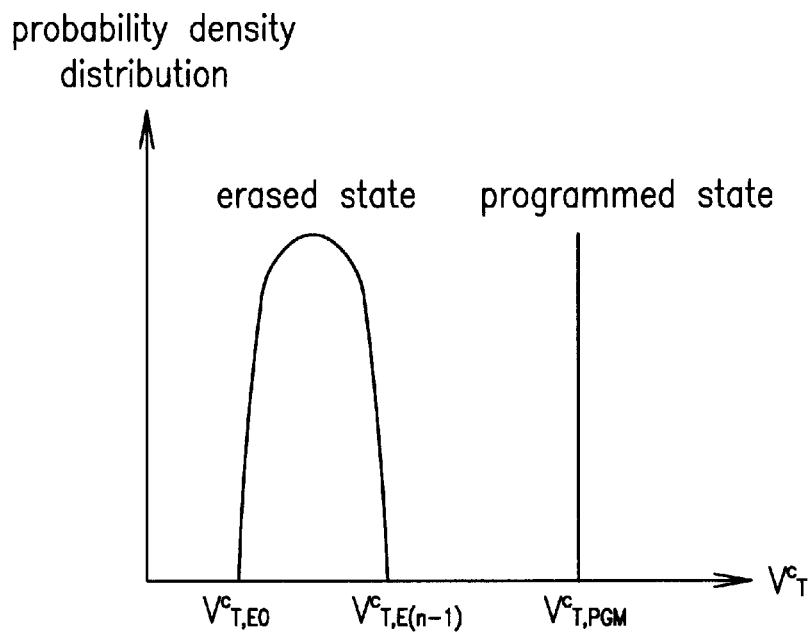
FIG. 7a illustrates a graph showing a distribution of threshold voltages when a first embodiment programming method of the present invention is applied to the memory cell with charge storage means.
Figure 7B:
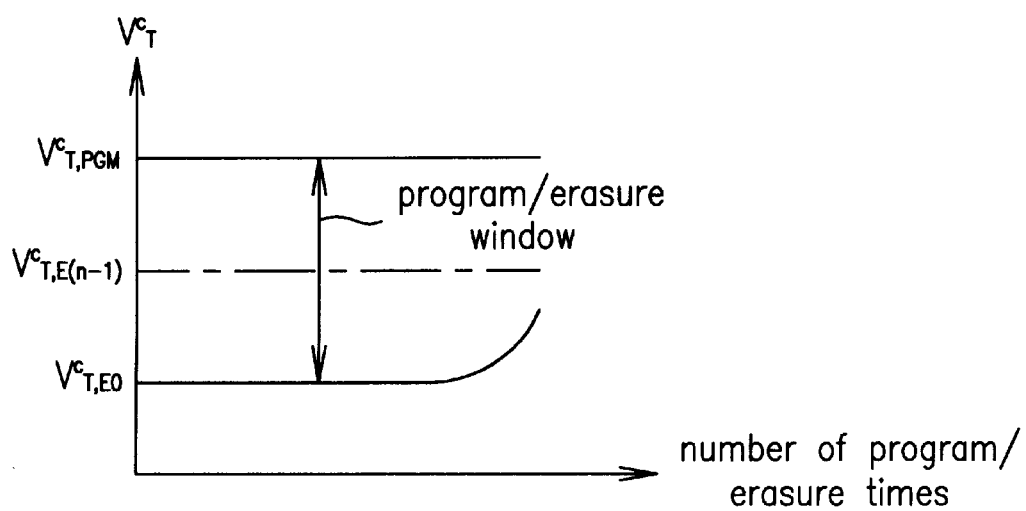
FIG. 7b illustrates a graph showing a distribution of threshold voltages vs. a program/erasure number of times when a first embodiment programming method of the present invention is applied to the memory cell with charge storage means.

A result of application of the first embodiment programming method of the present invention will be explained. FIG. 7a illustrates a graph showing a distribution of threshold voltages when a first embodiment programming method of the present invention is applied to the memory cell with charge storage means, and FIG. 7b illustrates a graph showing a distribution of threshold voltages vs. a program/erasure number of times when a first embodiment programming method of the present invention is applied to the memory cell with charge storage means.

When the programming method of the present invention is applied in a single level to a plurality of memory cells having control gate with threshold voltages $V^c{}_{T,E0} \sim V^c{}_{T,E(n-1)}$ different from one another in erasure states at which voltage in the control gate, the source, and the drain are held, all the threshold voltages $V^c{}_{T,PGM}$ monitored from the control gates have the same values after the programming as shown in FIG. 7a if $f^{-1}(I_{REF})$ are the same. The aforementioned principle may be applied to cells with threshold voltages erased in erasure operations different from one another or to a case when programming and erasure operation is applied to each cell respectively. In implies that, even in the case of application of the programming method of the present invention to a nonvolatile memory with cells of which charge storage means have amounts of initial charges $Q_{INIT}$ other than zero different from one another and which have a wide threshold voltage distribution, the cells will have the same threshold voltages after the programming. Because, even if the charge storage means have amounts of initial charges $Q_{INIT}$ different from one another after being erased, charge is stored in each charge storage means such that threshold voltages from the control gates are the same at the end when the programming is stopped in the middle at the same voltage bias and fixed reference current as shown in FIG. 4. In conclusion, when the programming method of the present invention is applied to the case when the charge storage means in a plurality of cells have erasure states with a wide threshold voltage distribution, the cells can have the same threshold voltage without any distribution as shown in FIG. 7a even in a single level programming. And, also in a programming and an erasure operations for one cell, as shown in FIG. 7b, distributions of all the threshold voltage $V^c{}_{T,PGM}$ levels are uniform after the programming, regardless of efficiencies of programmed cells or the physical or electrical degradation of the tunnel oxide films of cells caused in the repetitive programming and erasure process.

A relation between voltages applied to the source and the drain and the threshold voltage can be expressed as equations (10) and (11) shown below, using the equation (9).

$$\alpha V_T/\alpha s = Vc + [\alpha_D V_D + \alpha_S V_S - f^{-1}(I_{REF})]/\alpha s \quad (10)$$

$$\alpha c V_T/\alpha s = Vc + [\alpha_S V_S + \alpha c V_c - f^{-1}(I_{REF})]/\alpha_D \quad (11)$$

Next, a multi-level application of the programming method of the present invention will be explained.

In a multilevel application of the programming method of the present invention, one threshold voltage level should have very narrow width. That is, if a distribution of each threshold voltage level is made narrow, a cell can be programmed such that the cell has more threshold voltage levels(multi-level). The multilevel application of the programming method of the present invention, programming and verifying automatically, may be carried out in two ways. The first one is a multi-level programming in which voltages, applied to the source, drain, and control gate of the cell intended to be programmed in the program system of a nonvolatile memory shown in FIG. 3, are varied. The second one is a multi-level programming in which a reference current level, applied to the current monitoring unit 13 in the programming system of nonvolatile memory shown in FIG. 3, is varied. The first one may be conducted in three ways according to an electrode of the control gate, drain, and source to which the varying voltage is applied. Relations of a plurality of threshold voltages with a plurality of voltages applied to each node (the control gate, drain, and source) corresponding to the threshold voltages are expressed in equations (9), (10), and (11). And, relations of a plurality of threshold voltages with the reference current can be expressed as equations (12), (13), (14) and (15).

$$V_{T,i} = V_{c,i} + K1 \quad (12)$$

$$V_{T,j} = X1 x V_{D,j} + K2 \quad (13)$$

$$V_{T,m} = X2 x V_{s,m} + K3 \quad (14)$$

$$V_{T,n} = X3 x f^{-1}(I_{REF}) + K4 \quad (15)$$

Where, i, j, m, and n are integers (0, 1, 2, . . . ) denoting multi-level stages, and K1, K2, K3, K4, X1, X2, and X3 are constants expressed as equations (16), (17), (18), (19), and (20) shown below.

$$K1 = [\alpha_D V_D + \alpha_S V_S + f^{-1}(I_{REF})]/\alpha c \quad (16)$$

$$K2 = V_c + [\alpha_S V_S + f^{-1}(I_{REF})]/\alpha c \quad (17)$$

$$K3 = V_c + [\alpha_D V_D + f^{-1}(I_{REF})]/\alpha c \quad (18)$$

$$K4 = V_c + [\alpha_D V_D + \alpha_S V_S]/\alpha c \quad (19)$$

$$X1 = C_D/C_c, \ X2 = C_s/C_c, \ X3 = 1/C_c \quad (20)$$

Figure 8:
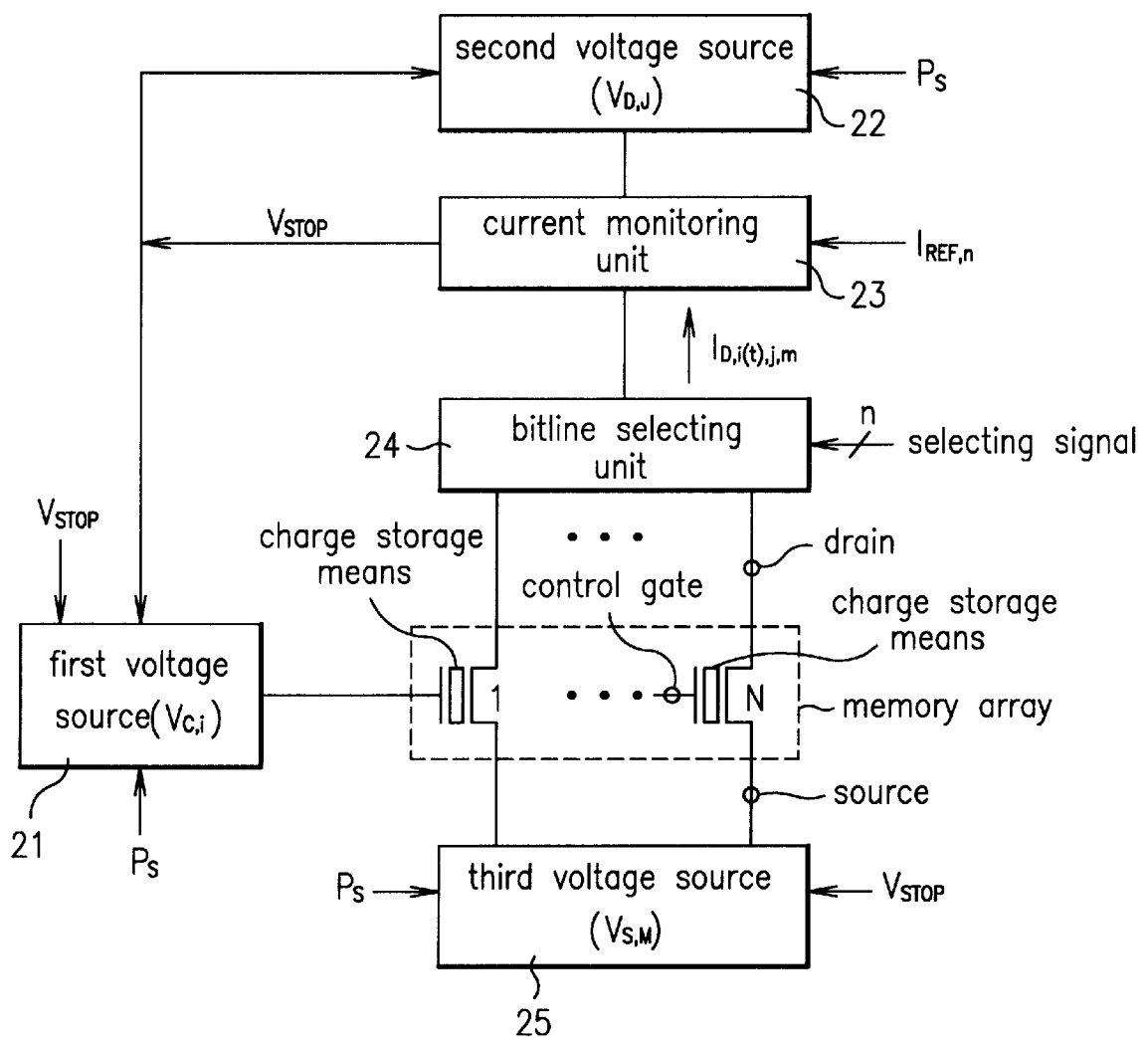
FIG. 8 illustrates a block diagram showing an automatic verification and programming system for a nonvolatile memory in accordance with a second embodiment of the present invention using an application of a variable voltage and a simultaneous current detection.

As shown in equations (12)~(15), the multi-level programming can be conducted in four different methods depending on which one of voltages of the drain, source, and control gate, and the reference current is taken as a variable. A programming system of a nonvolatile memory of the present invention for aforementioned methods is shown in FIG. 8. That is, FIG. 8 illustrates a block diagram explaining an auto verification and programming using a variable voltage application on the same time with a current monitoring in accordance with a second embodiment of the present invention.

Referring to FIG. 8, the system for programming a nonvolatile memory in accordance with the second embodiment of the present invention includes a plurality of memory cells each having an FET with a source, a drain, and a control gate, and charge storage means, a first voltage source 21 adapted to be applied to the control gate, a third voltage source 25 adapted to be applied to the source, a second voltage source 22 adapted to be applied to the drain, a current monitoring unit 23 for monitoring a current flowing between the drain and the source, and a bitline selecting unit 24 for selecting the drain of a particular cell for conduction of programming.

The method for conducting a multi-level programming, with one selected from voltages applied to the drain, source, and control gate, and the reference current will be explained.

First, in conducting a multi-level programming using the control gate voltage, as indicated in equations (12) and (16), the first voltage source 21 provides a voltage Vc, i(i=0, 1, 2, . . . , n−1) corresponding to each threshold voltage level $V^c_{T,i}$ to the control gate of a selected nonvolatile memory cell. And, the second voltage source 22 applies a fixed voltage $V_D$ to the drain, and the third voltage source 25 applies a fixed voltage Vs to the source. For convenience of explanation, it is assumed that the source voltage is at a ground level(Vs=0V). If the FET is in a saturation mode in which the FET has a channel current having no relation to the drain voltage at a moment of being programmed, or the drain coupling constant is very small, the drain voltage may be applied with variation given. The unexplained reference symbol $I_{D,i}(t)$ denotes a current flowing in the drain of the selected cell in an ith threshold level programming. As shown in the equation (16), the current monitoring unit 23 has a fixed reference current $I_{REF}$, and issues a programming stop signal Vstop when the drain current $I_{D,i}(t)$ flowing through the drain reaches to the reference current $I_{REF}$ during an ith threshold level programming. The time $t_{P,i}$ denotes a time at which the ith threshold level programming is completed. The reference current $I_{REF}$ of the current monitoring unit 23 is determined according to an electrical characteristic of the nonvolatile memory cell using the programming method of the present invention. If the drain current $I_{D,i}(t)$ is defined again, the drain current $I_{D,i}(t)$ is a current dependent on time. This current $I_{D,i}(t)$ is a current in a drain of a selected cell triggered by a voltage Vcsm, i(t) in the charge storage means during the ith level programming, which is the greatest at an initial programming and keeps decreasing while the programming proceeds. And, the current monitoring unit 23 issues a programming stop signal Vstop at a time when the decreased current is reached to the reference current $I_{REF}$ of the current monitoring unit 23.

A two level or multi-level programming under aforementioned condition will be explained. FIGS. 9a~9h illustrate waveforms at each node showing the multi-level programming process using a variable control gate voltage in FIG. 8, and FIG. 10 illustrates a flow chart showing the steps of the multi-level programming process using a variable control gate voltage in FIG. 8.

It is assumed that the cell selected by the bitline selecting unit is in an erased state before starting the programming. The erased state is the lowest level, a level zero. And, it is further assumed that the FET therein has an n type channel formed on a p type substrate, the charge storage means is present between the control gate and the channel, and the channel current varies with the charge stored in the charge storage means.

Figure 9:
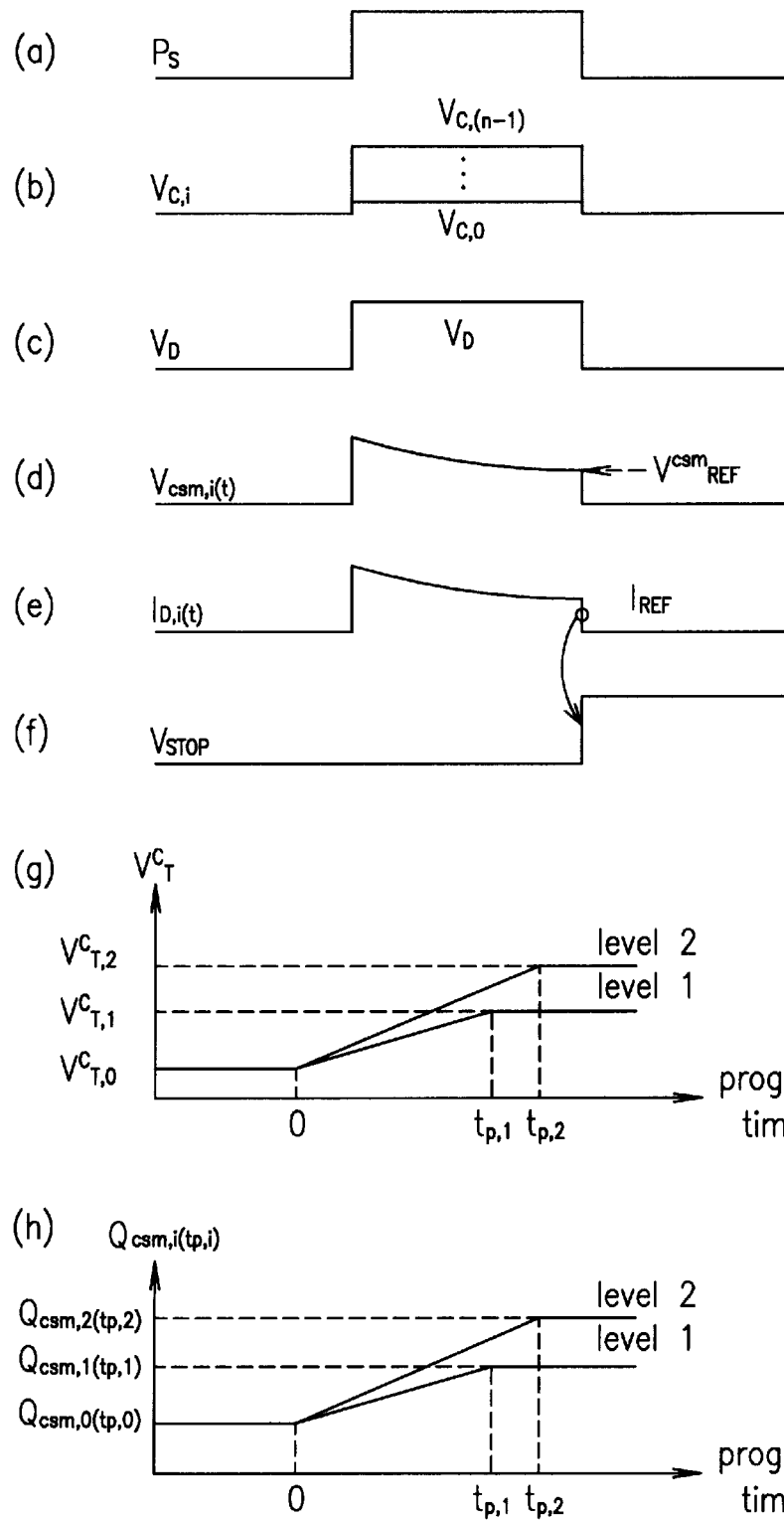
FIGS. 9a~9h illustrate waveforms at each node showing the multi-level programming process using a variable control gate voltage in FIG. 8.
Figure 10:
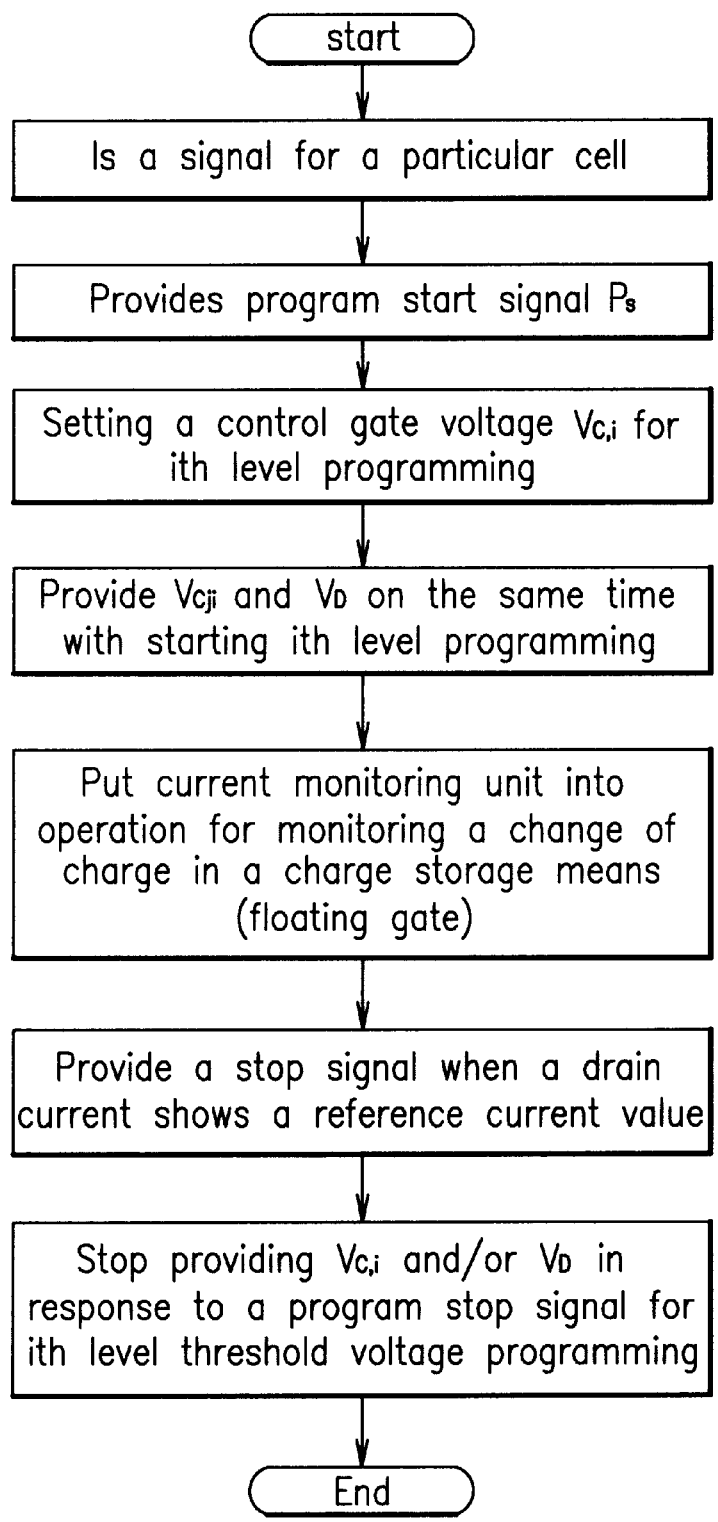
FIG. 10 illustrates a flow chart showing the multi-level programming process using a variable control gate voltage in FIG. 8.

First, for the two level or multi-level programming, after an external application of a plurality of addresses of a particular cell to the drain selecting unit, to select the particular cell to be programmed, when a programming start signal Ps as shown in FIG. 9a is provided to the first, second, and third voltage sources 21, 22, and 23, a voltage Vc, i for application to the control gate for an ith level programming is set. And, voltages Vc, i and $V_D$ as shown in FIGS. 9b and 9c are provided to the control gate and the drain from the first voltage source 21 and the second voltage source 22 respectively on the same time with the provision of the programming start signal Ps as shown in FIG. 9a. After the application of the voltages Vc, i and $V_D$ to the control gate and the drain respectively, the current monitoring unit 23 is actuated for monitoring a charge variation in the charge storage means. And, upon application of the voltages Vc, i and $V_D$ to the control gate and the drain respectively, a voltage Vcsm, i(t), as shown in FIG. 9d, for conducting the ith threshold level programming is provided to the charge storage means and an inversion layer is formed in the channel region of the FET. Since the source, drain, and the channel region are actually within a semiconductor substrate, once the inversion layer is formed, a current starts to flow from the drain to the source through the channel region. In this instance, there is a drain current $I_{D,i}(t)$ flowing through the drain, which is the greatest initially and decreases as the programming proceeds because the electrons are injected into the charge storage means, with a consequential drop of the voltage in the charge storage means. Thus, during the ith threshold level programming, the current monitoring unit 23 monitors the drain current $I_{D,i}(t)$. And, when the drain current $I_{D,i}(t)$ reaches to the reference current $I_{REF}$ as shown in FIG. 9e, taking it as a completion of the ith threshold level programming, the current monitoring unit 23 issues a programming stop signal Vstop as shown in FIG. 9f. Herein, though the current monitoring unit 23 is adapted to monitor the drain current $I_{D,i}(t)$, the current monitoring unit 23 may be adapted to monitor a voltage or a charge in the charge storage means as shown in FIGS. 9g and 9h respectively during the programming. That is, when the drain current $I_{D,i}(t)$ reaches to the reference current $I_{REF}$, the voltage in the charge storage means reaches to a reference voltage $V^{csm}_{REF}$ of the charge storage means corresponding to the reference current $I_{REF}$. And, in place of monitoring the current $I_{D,i}(t)$, a conductivity of the inversion layer formed in the channel region may be monitored. The objective of the monitoring may be any signal that varies with the charge storage means. For example, the monitoring objective may be a source current, or a substrate current other than the drain current, and a voltage signal from a capacitive coupling. In FIG. 8, the programming stop signal is provided to the first, and second voltage sources 21 and 22. And, at least one of the first, and second voltage sources 21 and 22 receives the programming stop signal Vstop, the voltages Vc, i and $V_D$, as shown in FIGS. 9b and 9b, to the control gate and the drain respectively are stopped. That is, when the current $I_{D,i}(t)$ is identical or below the reference current $I_{REF}$ at $t=t_{P,i}$, the ith threshold level programming is completed. Accordingly, the $t=t_{P,i}$ represents a time at which the ith threshold level programming is completed.

Figure 11A:
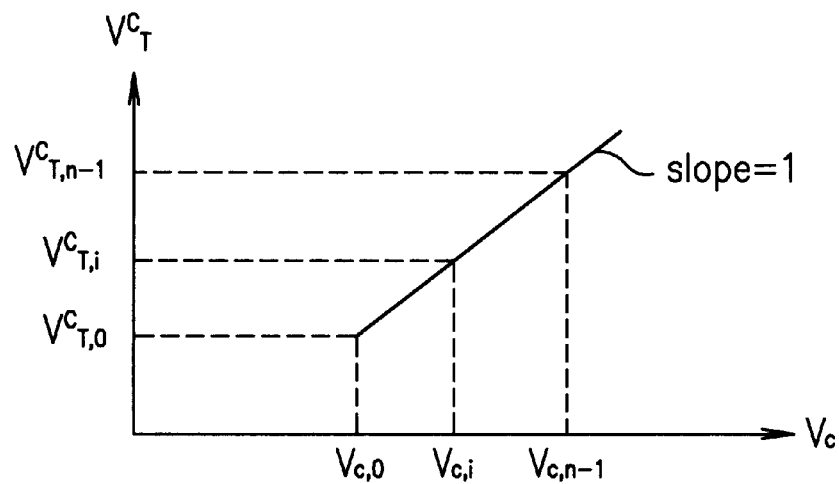
FIG. 11a illustrates a graph showing a threshold voltage level to be programmed vs. an applied control gate voltage pertinent to the threshold voltage level.
Figure 11B:
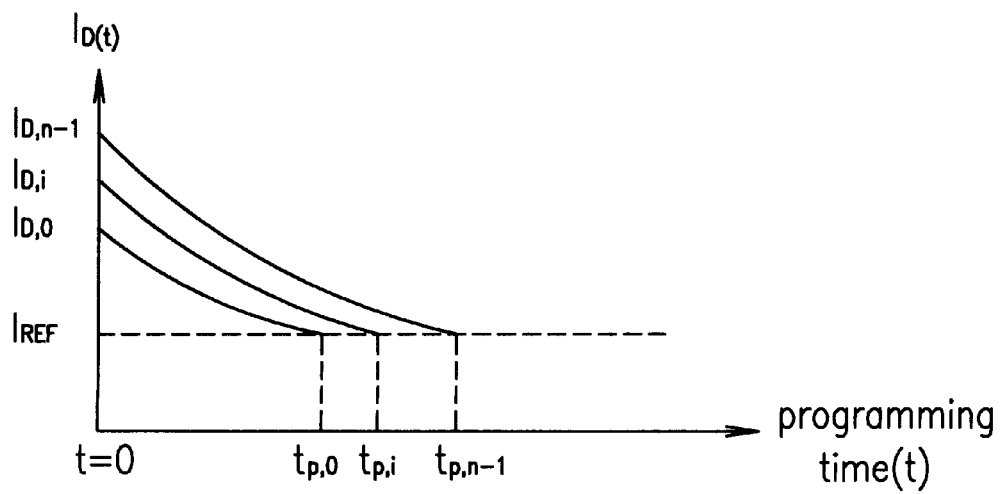
FIG. 11b illustrates a graph showing variation of a drain current from starting to end of programming for each level.

FIG. 9g illustrate a graph showing changes of threshold voltages $V^c_{T,1}$ and $V^c_{T,2}$ at the control gate on time when the ith threshold levels are the first, and second levels, wherein it can be known that the threshold voltage rises as the programming time elapses. And, it can also be known that the threshold voltage $V^c_{T,i}$ also rises as an order of the level of the multi-level programming is increased, at which the Vc,i is raised to carry out the programming. The time periods for the first, and second level programmings differ because variations in the control gate voltages and the threshold voltages for each of the levels are different. FIG. 9h illustrates a graph showing changes of charges in the charge storage means from an initial floating gate charge $Qcsm,_0(0)$ to $Qcsm,_1(t_{P,1})$ at which the first threshold voltage level programming is completed and to $Qcsm,_2(t_{P,2})$ at which the first threshold voltage level programming is completed respectively when the ith threshold level is the first, and second threshold levels. From FIG. 9h, it can be known that charges in the charge storage means in cases when both voltages $Vcsm,_1(t)$ and $Vcsm,_2(t)$ reach to the reference voltage $V^{csm}_{REF}$ in the charge storage means corresponding to the reference current $I_{REF}$ increase from the initial value $Qcsm,0(0)$ to $Qcsm,_1(t_{P,1})$ and $Qcsm,_2(t_{P,2})$, respectively. If the initial threshold voltage are the same, since the $V^{csm}_{REF}$ are identical for all levels of programming and the Vc, i rises as it goes to a higher level, an initial value of the drain current $I_{D,i}(0)$ also increases as it goes to a higher level. This process is shown in FIGS. 11a and 11b. FIG. 11a illustrates a graph showing a threshold voltage level to be programmed vs. an applied control gate voltage pertinent to the threshold voltage level, and FIG. 11b illustrates a graph showing variation of a drain current from starting to end of programming for each level. A programming end time for each level depends on an electrical characteristic of the memory cell and a voltage applied to each node. That is, the programming method using the programming system of a nonvolatile memory of the present invention has no relation with a device programming efficiency.

Next, the control gate voltage $Vc,_0$ and the reference current $I_{REF}$ for conducting the lowest level programming are determined as follows. When a desired lowest threshold level $V^c_{T,0}$, a fixed drain voltage $V_D$, and a fixed source voltage Vs for a given memory cell are determined, there are two parameters of $V_{c,0}$ and $f^{-1}(I_{REF})$, a function of the reference current, remained in the equations (10) and (14). Since the drain voltage $V_D$ and the source voltage Vs are fixed, the $V^{csm}_{REF}$ corresponds to the $I_{REF}$ in one to one fashion from equations (6) and (7). Then, after the given memory cell is regulated with $V^c_{T,0}$, $V_{c,0}$, $V_D$, and Vs are applied to the memory cell, and the initial drain current $I_{D,0}(0)$ is measured. This $I_{D,0}(0)$ is the very $I_{REF}$. The $V_{c,0}$ is determined taking a programming time period and a maximum control gate voltage $V_{c,n-1}$ into account. Once the $V_{c,0}$ is determined, $I_{REF}$ can be obtained by the aforementioned operation. The $I_{REF}$ can be measured in different method other than this. As explained before, for a multi-level programming it is not necessary to compare a current flowing through a channel of a selected memory cell with the reference current in the current monitoring unit 23 and stop the programming at the same time point. The current $I_{REF}$ may be amplified or reduced before application to the current monitoring unit 23. In this instance, provided that all the programmings are stopped at the same fixed arbitrary current values for all the levels in the multi-level programming, a threshold voltage shift and a control gate shift are identical.

Figure 12A:
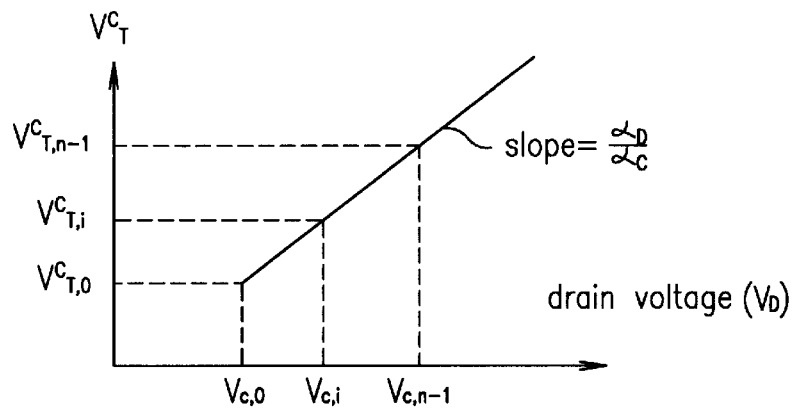
FIG. 12a illustrates a graph showing a threshold voltage level to be programmed vs. an applied drain voltage pertinent to the threshold voltage level.
Figure 12B:
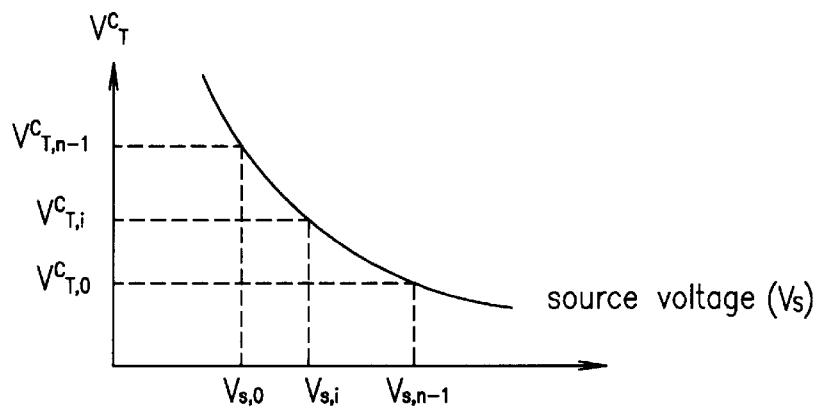
FIG. 12b illustrates a graph showing a threshold voltage level to be programmed vs. an applied source voltage pertinent to the threshold voltage level.

And, for the multi-level programming, a voltage applied to either the drain or the source may be used in view of equations (13) and (14), in which a voltage to either the drain or the source is taken as variable in a process the same as the programming method using the control gate. Relations of the threshold voltage levels to be programmed with the drain and source and the reference voltages applied corresponding to the threshold voltage levels will be explained with reference to the drawings. FIG. 12a illustrates a graph showing a threshold voltage level to be programmed vs. an applied drain voltage pertinent to the threshold voltage level, FIG. 12b illustrates a graph showing a threshold voltage level to be programmed vs. an applied source voltage pertinent to the threshold voltage level, and FIG. 12c illustrates a graph showing a threshold voltage level to be programmed vs. an applied reference current pertinent to the threshold voltage level.

Referring to FIG. 12a, in the multi-level programming taking the drain voltage as a variable, a shift slope of a drain voltage shift to a threshold voltage shift can be expressed as a ratio $\alpha_D/\alpha c$ of a control gate coupling parameter $\alpha c$ to a drain coupling parameter $\alpha_D$. It the two coupling parameters are the same, the slope is 1.

Next, before giving an explanation on a case when the multi-level programming is conducted taking the source voltage as a variable, it is assumed that the source voltage which is a reference voltage on reading the threshold voltage is zero. In conduction of the programming using the source voltage, there is one thing that should be kept in mind; as shown in FIG. 12b, a threshold voltage shift slope accounts on a back bias effect of the source voltage of the FET in addition to a source coupling parameter ($\alpha s/\alpha c$). If the programming is stopped at the identical reference current, a threshold voltage shift occurred in the case when the source voltage is not applied is smaller than the case when the source voltage is applied. Because the stopping of the programming at the identical reference current while the programming is carried out with a voltage applied to the source brings about the same effect as the case when the programming is carried out with the source voltage grounded and the reference current elevated higher. In this instance, the source voltage and the threshold voltage shift are, not linear, but reversely proportional.

Figure 12C:
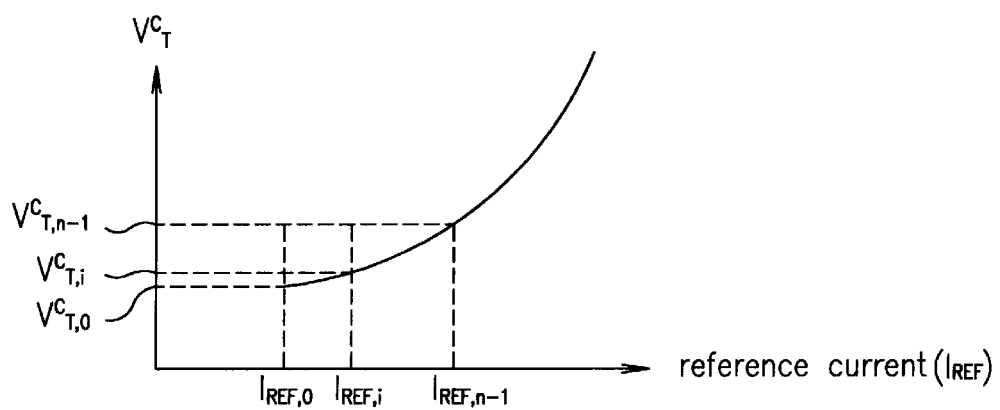
FIG. 12c illustrates a graph showing a threshold voltage level to be programmed vs. an applied reference current pertinent to the threshold voltage level.

Referring to FIG. 12c, in the multi-level programming taking the reference current as a variable, a variation of the reference current and a threshold voltage shift is proportional. Therefore, in this case, a plurality of threshold voltages which makes a difference of the threshold voltages constant are fixed, and current values corresponding to the threshold voltage can be obtained experimentally or using a circuitry method. Because all the threshold voltages and differences between the threshold voltages can be fixed regardless of a number of cycling times of the programming and erasure of cell for a plurality of cells when the aforementioned method is applied, the aforementioned method is favorable for a multi-level programming more than the background art repetitive program pulse application and verification using the reference current.

Since the subject matter of the present invention has no relation with a programming mechanism, it can be known that the subject matter of the present invention is applicable to any type of programming mechanism. If the hot carrier injection is used, the source voltage is grounded, and positive voltages enough to cause programming by the hot carrier injection are applied as the drain voltage and the control gate voltage. In this instance, the programming is stopped when a current between the drain and the source, which is a programming current monitored, reaches to $I_{REF}$. If the tunneling is used, the control gate is applied of a positive voltage, and the drain and the source are applied of voltages equal to or lower than 0V, so that an electric field enough to cause tunneling between the charge storage means and the drain, source, and channel region is formed. In this instance, the drain voltage higher than the source voltage is applied, to cause current flowing between the drain and the source, which is monitored to stop the programming when it reaches to $I_{REF}$. And, when negative voltages are applied to the drain or the source, the substrate should be applied of a voltage equal to or lower than the voltages applied to the drain and the source in case the drain and the source are n type impurity regions and the substrate is a p type semiconductor. Up to now, a single level and a multi-level programming methods have been explained.

An erasure state and a programmed state caused by the programming method of the present invention will be explained.

Figure 13A:
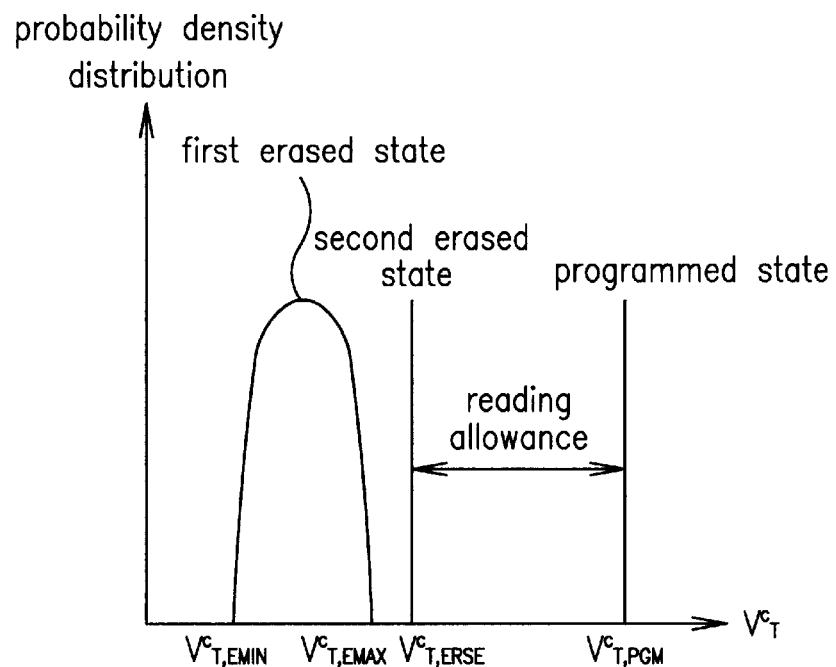
FIG. 13a illustrates a graph showing distribution of threshold voltages in programming and erasure when the method of the present invention is applied to an erasure operation; and, FIG. 13b illustrates a graph showing a variation of threshold voltages according to a number of program/erasure when the method of the present invention is applied to an erasure operation.

In an erasing operation, voltages which can establish fields enough to erase the charges stored in the charge storage means between the charge storage means and the source, drain, and channel region are applied to each terminal of the source, drain, and channel region, for erasing the charges toward the source, drain, or the channel region by tunneling. There can be two erasure states in the present invention. The first erasure state has a wide probability density distribution of the erasure as shown in FIG. 13a. This first erasure state appears when an erasure pulse lower than a threshold voltage for a second erasure state is applied to remove sufficient charges from the charge storage means of the cell, which becomes wider as the cell is degraded. The second erasure state has a minimum or no erasure state as shown in FIG. 13a, which appears when all the threshold voltages of memory cells with a fixed erasure distribution are caused to be the same lowest threshold level $V^c_{T,0}$.

Figure 2A:
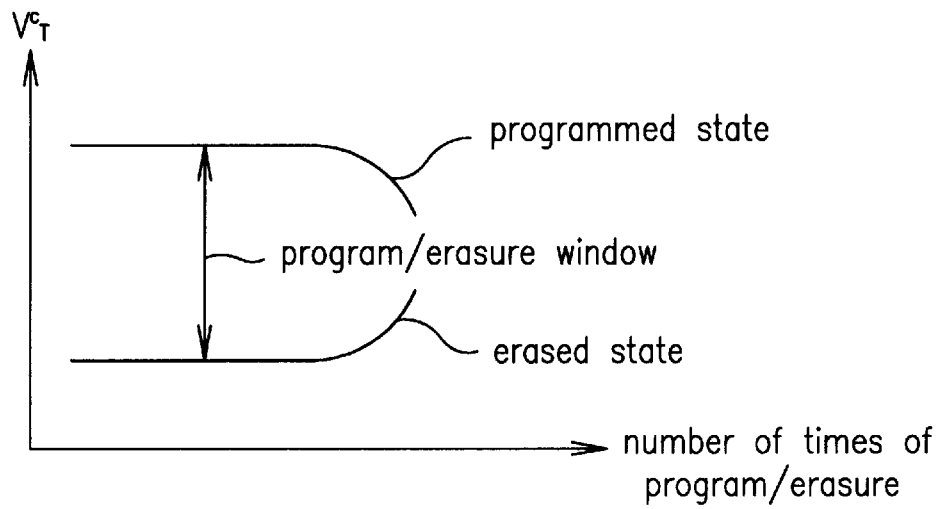
FIG. 2a illustrates a graph showing a program/erasure window gradually lowered as a number of the program/erasure is increased according to a second exemplary background art method of program and verification repetition.
Figure 2B:
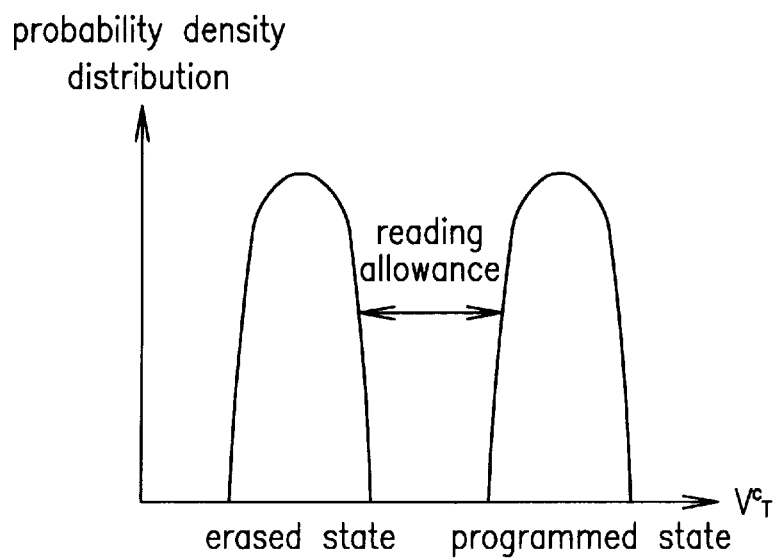
FIG. 2b illustrates a graph showing a distribution of threshold voltages in the second exemplary background art method.
Figure 13B:
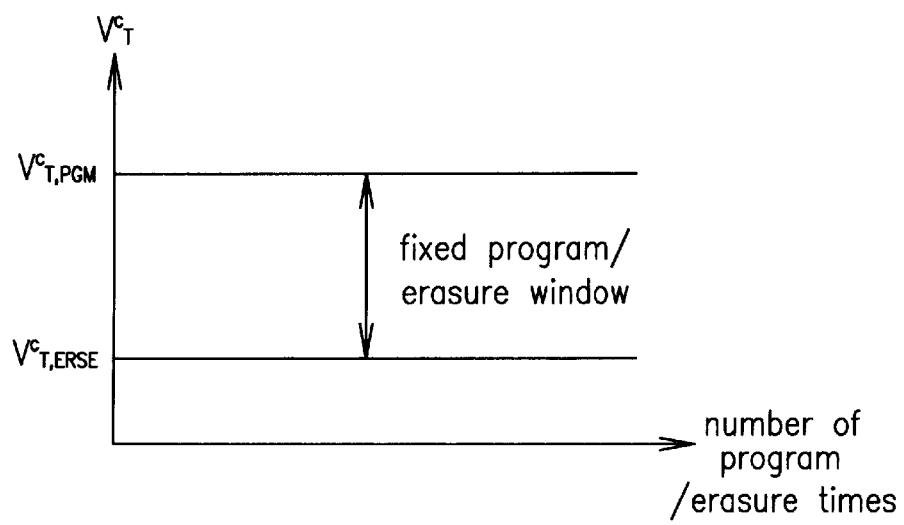

And, for causing the programmed state, an automatic verification and programming is used while varying voltages to the drain, or the control gate, or the reference current to correspond to the threshold voltage in the programmed state. As shown in FIG. 2a, in the background art programming method by programming and verification, though the program/erasure window is reduced due to a drop of a program efficiency as a number of times of the program/erasure is increased, as shown in FIG. 13b, in the programming method of the present invention, the program/erasure window is maintained regardless of the program efficiency even though the number of times of the program/erasure is increased, with a reading allowance maintained the same, thereby lengthening a lifetime of the cells.

The system and method for programming a nonvolatile memory of the present invention as have been explained have the following advantages.

First, when a single level programming method of the present invention is applied to a plurality of memory cells, all the memory cells become to have the same threshold voltage irrespective of an initial threshold voltage distribution. That is, the programming method of the present invention can remove a threshold voltage distribution coming from gate insulator thicknesses and channel doping concentrations due to variations of process.

Second, when the programming and erasure is applied to one memory cell respectively, the programmed memory cell always has the same programmed threshold voltage regardless of the program/erasure number of times of the memory cell, prolonging a lifetime of the memory cell.

Third, a multi-level programming can be conducted varying voltages to the control gate, drain, or source, or the reference current in programming of every threshold level.

Fourth, since each threshold voltage level and the control gate voltage or the drain voltage corresponding to the threshold voltage level are related linearly, and a threshold voltage shift and the control gate voltage shift are the same, a threshold voltage shift of each level can be controlled accurately.

Fifth, the unnecessity for a separate circuit for use in verification of a programming coming from the conduction of simultaneous programming and reading by the nonvolatile memory cell itself allows a faster programming.

Sixth, a programming before erasure of a stored charge is not required.

Seventh, an accuracy of a multi-level programming, i.e., an error distribution of programmed voltages is accurately determined simply by bias voltages regardless of parameters determining a threshold voltage of the charge storage means fixed on fabrication of the nonvolatile memory. Therefore, a threshold voltage error distribution of each level of the nonvolatile memory of the present invention has no relation with the number of times of the program/erasure. And, even during a programming, a charge trap into an oxide film, a channel mobility, and a bitline resistance can not cause any unstable operation or unexpectable electrical factors affect operation.

Eighth, the removal of malfunction of the cell coming from excessive erasure and excessive programming improves a reliability of an entire chip.

Ninth, the multi-level programming using voltages to the control gate, the drain, or the source of the memory cell allows a precise control of intervals of the threshold voltage levels better than the background art multi-level programming using the current.

Tenth, in comparison to the background art current controlling type using a reference current, the present invention can carry out a multi-level programming much more accurately than the background art repetitive programming and verification.

Eleventh, if the multi-level programming is carried out with the control gate increased little by little, a low voltage and low current operation is possible.

Twelfth, the programming method of the present invention is applicable to a nonvolatile memory with a floating gate, a nonvolatile memory of MONOS form having a trap at an interface between an oxide and nitrogen as a charge storage means, or a nonvolatile memory with an analog memory system or a capacitor.

It will be apparent to those skilled in the art that various modifications and variations can be made in the system and method for programming a nonvolatile memory of the present invention without departing from the spirit or scope of the invention. Thus, it is intended that the present invention cover the modifications and variations of this invention provided they come within the scope of the appended claims and their equivalents.

What is claimed is:

1. A system for programming a nonvolatile memory comprising:
    a plurality of memory cells each having a field effect transistor with a control gate, a drain, a source, and charge storage means;
    select means for selecting a specified memory cell for programming;
    voltage means for applying preset voltages pertinent to a threshold level to the source, the drain, and the control gate in the specified memory cell;
    monitor means for monitoring a current flowing through a channel in the specified memory cell; and
    stop means for stopping at least one of the preset voltages applied to the source, the drain, and the control gate in the specified memory cell when the monitor means senses that the current flowing through the channel reaches a reference current value.

2. A system for programming a nonvolatile memory comprising.
    a plurality of memory cells each having a field effect transistor with a control gate, a drain, a source, and charge storage means;
    voltage means for applying at least one of a plurality of threshold voltages pertinent to a plurality of threshold levels to the source, the drain, and the control gate in each of the memory cells;
    monitor means for monitoring a current flowing through a channel in each of the memory cells; and
    stop means for stopping at least one of the threshold voltages applied to the source, the drain, and the control gate in each of the memory cells when the monitor means senses that the current flowing through the channel reaches at least one of a plurality of reference current values pertinent to the plurality of threshold levels of the memory cell.

3. A system for programming a nonvolatile memory comprising
    a plurality of memory cells each having a field effect transistor with a control gate, a drain, a source, and charge storage means;
    voltage means for applying voltages pertinent to a particular level to the source, the drain, and the control gate in at least one of the plurality of memory cells;
    monitor means for monitoring a current flowing through a channel in said at least one of the plurality of memory cells at a same time when the voltage means applies the voltages; and
    stop means for stopping at least one of the voltages applied to said at least one of the plurality of memory cells when the current flowing through the channel in said at least one of the memory cells reaches at least one of a plurality of reference currents pertinent to the particular level.

4. A system for programming a nonvolatile memory comprising:
    a plurality of memory cells each having a field effect transistor with a control gate, a drain, a source, and charge storage means;
    voltage means for applying at least one of a plurality of voltages pertinent to a plurality of threshold levels to the source, the drain, and the control gate in at least one of the plurality of memory cells;
    monitor means for monitoring a current flowing through a channel in said at least one of the plurality of memory cells at a same time when the voltage means applies said at least one of the plurality of voltages; and
    stop means for stopping said at least one of the plurality of voltages applied when the current flowing through the channel in said at least one of the plurality of memory cells reaches at least one of a plurality of reference currents pertinent to the particular threshold levels.

5. A nonvolatile memory programming system for changing a memory state to a selected memory state in a nonvolatile memory system comprising:
    select means for selecting one memory cell having a source, a drain, a control gate, and charge storage means out of a plurality of memory cells, the charge storage means storing a particular charge level pertinent to the selected memory state, the charge storage means being in static capacitive relations with the source, the drain, and the control gate;
    voltage means for applying a voltage to the drain, the source, and the control gate which can cause a current to flow in a channel between the drain and the source in said one memory cell, the voltage being adequate for moving charges to the charge storage means in said one memory cell, and pertinent to the selected memory state;
    monitor means for monitoring the current flowing through the channel during the movement of the charges to the charge storage means in said one memory cell; and,
    stop means for stopping the movement of the charges to the charge storage means when the monitor means finds that the current flowing through the channel reaches a reference current.

6. The system as claimed in claim 5, wherein the charge storage means includes at least one floating gate.

7. The system as claimed in claim 5, wherein the charge storage means includes an interface of an oxygen layer and a nitrogen layer.

8. The system as claimed in claim 5, wherein said one memory cell includes the charge storage means present at least on a portion of the channel between the source and the drain.

9. The system as claimed in claim 5, wherein said one memory cell includes the control gate existing on, one side, or under the charge storage means.

10. The system as claimed in claim 5, wherein the monitor means also monitors a voltage of the charge storage means.

11. The system as claimed in claim 5, wherein the monitor means monitors the particular charge level stored in the charge storage means.

12. The system as claimed in claim 5, wherein the monitor means monitors a conductivity of a charge inversion layer in the channel between the source and the drain caused by the charge storage means.

13. The system as claimed in claim 5, wherein the monitor means includes a circuit for comparing the reference current to the current flowing between the source and the drain.

14. The system as claimed in claim 5, wherein the monitor means is connected to at least one of the voltage means and the drain for changing a state of said one memory cell.

15. The system as claimed in claim 5, wherein the monitor means is connected to at least one of the voltage means and the source for changing a state of said one memory cell.

16. The system as claimed in claim 5, wherein the voltage means are adapted to apply a high voltage to the drain and a low voltage to the source for changing a state of said one memory cell.

17. The system as claimed in claim 5, wherein the charges stored in the charge storage means includes negative charges.

18. The system as claimed in claim 5, wherein the movement of the charges to the charge storage means includes an injection of negative charges into the charge storage means.

19. The system as claimed in claim 5, wherein the reference current has at least one fixed current value corresponding to charges stored in the charge storage means.

20. The system as claimed in claim 5, wherein the reference current includes a threshold current value.

21. The system as claimed in claim 5, wherein the stop means stops at least one of the voltages applied to the source, the drain, and the control gate.

22. A nonvolatile memory programming system comprising:
select means for selecting a specified electrically programmable memory cell having a source, a drain, a control gate, and charge storage means out of a plurality of electrically programmable memory cells, the charge storage means storing a plurality of charge levels pertinent to a plurality of memory cell states, the plurality of charge levels controlling a current flow in a channel existing between the source and the drain, the charge storage means being in static capacitive relations with the source, the drain, and the control gate;
voltage means for respectively applying voltages to the drain, the source, and the control gate in said specified electronically programmable memory cell, the voltages being adequate to cause a charge movement toward the charge storage means in said specified electronically programmable memory cell and linearly proportional to a plurality of threshold voltages;
monitor means for monitoring a current while there is the charge movement toward the charge storage means; and,
stop means for stopping the charge movement toward the charge storage means when the monitor means finds that the current flowing through the channel reaches a reference current, thereby changing a state of said specified electronically programmable memory cell to the plurality of memory cell states corresponding to the plurality of threshold voltages.

23. A system for programming a nonvolatile memory comprising:
select means for selecting a memory cell having a source, a drain, a control gate, and charge storage means out of a plurality of memory cells, the charge storage means connected to the source, the drain, and the control gate in static capacitive relations;
voltage means for applying voltages to the source, the drain, and the control gate, the voltages being adequate for causing both a current flow in a channel between the drain and the source and a charge movement toward the charge storage means; and,
stop means for stopping the charge movement toward the charge storage means when an amount of charges stored in the charge storage means reaches a level pertinent to a voltage applied to the control gate and a reference current.

24. The system as claimed in claim 23, wherein the charge storage means in the memory cell includes a floating gate, a trap at an interface between an oxide layer and a nitride layer, or a capacitor.

25. A system for programming a nonvolatile memory comprising:
a memory array having a plurality of memory cells each having a source, a drain, a control gate, and charge storage means connected to the source, the drain, and the control gate in static capacitive relations;
a select unit for selecting a desired memory cell for programming; and
monitor means for monitoring an amount of charges stored in the charge storage means in the desired memory cell when voltages linearly proportional to the plurality of threshold voltages are applied to the drains, the sources, and the control gates in the desired memory cell, so that when the amount of charges reaches a level corresponding to a plurality of threshold voltages, a charge movement toward the charge storage means is stopped, thereby programming the desired memory cell to have a plurality of memory states.

26. A programming method using a programming system for a nonvolatile memory, the nonvolatile memory including multiple nonvolatile memory cells each having a source, a drain, a control gate, and a charge storage means connected to the source, the drain, and the control gate in static capacitance relations for controlling a current flowing in a channel between the source and the drain by means of a charge stored in the charge storage means, the programming method comprising the steps of:
selecting a specified memory cell for programming;
applying voltages to the drain, the source, and the control gate of the specified memory cell, the voltages being pertinent to a preset threshold voltage and enough to cause a charge movement toward the charge storage means;
monitoring the current flowing in the channel between the source and the drain; and,
stopping at least one of the voltages applied to the source, the drain, and the control gate when it is monitored that the current flowing in the channel reaches a reference current corresponding to a preset threshold voltage.

27. A programming method using a programming system for a nonvolatile memory, the nonvolatile memory including a plurality of nonvolatile memory cells each having a source, a drain, a control gate, and a charge storage means connected to the source, the drain, and the control gate in static capacitance relations for controlling a current flowing in a channel between the source and the drain by means of a charge stored in the charge storage means, the programming method comprising the steps of:
selecting at least one nonvolatile memory cell for programming;
applying voltages to the drain, the source, and the control gate in said at least one nonvolatile memory cell, the voltages being pertinent to a preset threshold voltage; and,
stopping at least one of the voltages applied to the source, the drain and the control gate when it is monitored that the current flowing in the channel between the source and the drain in said at least one nonvolatile memory cell reaches a reference current corresponding to a preset threshold voltage.

28. A programming method using a programming system for a nonvolatile memory, the nonvolatile memory including a plurality of nonvolatile memory cells each having a source, a drain, a control gate, and charge storage means connected to the source, the drain, and the control gate in static capacitance relations for controlling a current flowing in a channel between the source and the drain by means of a charge stored in the charge storage means, the programming method comprising the steps of:

applying at least one of a plurality of voltages pertinent to a plurality of threshold levels to one of the drain, the source, and the control gate in at least one selected nonvolatile memory cell and applying fixed voltages to remaining two electrodes of the drain, the source, and the control gate;

monitoring the current flowing in the channel in said at least one selected nonvolatile memory cell; and, stopping at least one of the voltages applied to the source, the drain, and the control gate in said at least one selected nonvolatile memory cell when it is monitored that the current flowing in the channel reaches a reference current.

29. A programming method using a programming system for a nonvolatile memory, the nonvolatile memory including nonvolatile memory cells each having a source, a drain, a control gate, and a charge storage means connected to the source, the drain, and the control gate in static capacitance relations for controlling a current flowing in a channel between the source and the drain by means of a charge stored in the charge storage means, the programming method comprising the steps of:

applying voltages to the drain, the source, and the control gate of a memory cell respectively, the voltages being adequate for programming;

monitoring the current flowing in the channel; and, stopping at least one of the voltages applied to the source, the drain, and the control gate when it is monitored that the current flowing in the channel reaches one of a plurality of reference current levels corresponding to a plurality of threshold levels.

30. A programming method using a programming system for a nonvolatile memory, the nonvolatile memory including a plurality of nonvolatile memory cells each having a source, a drain, a control gate, and charge storage means connected to the source, the drain, and the control gate in static capacitance relations for controlling a current flowing in a channel between the source and the drain by means of a charge stored in the charge storage means, the programming method comprising the steps of:

applying voltages to the drain, the source, and the control gate in at least one of the plurality of nonvolatile memory cells respectively, the voltage being adequate for programming;

monitoring the current flowing in the channel in the at least one of the plurality of nonvolatile memory cells; and, stopping at least one of the voltages applied to the source, the drain and the control gate when it is monitored that the current flowing in the channel in the at least one of the plurality of nonvolatile memory cells reaches at least one of a plurality of reference current levels corresponding to a plurality of threshold levels.

31. A programming method using a programming system for a nonvolatile memory, the nonvolatile memory including a plurality of nonvolatile memory cells each having a source, a drain, a control gate, and charge storage means connected to the source, the drain, and the control gate in static capacitance relations for controlling a current flowing in a channel between the source and the drain by means of a charge stored in the charge e storage means, the programming method comprising the steps of:

applying at least one of a plurality of voltages corresponding to a plurality of threshold levels to the drain, the source, and the control gate in at least one of the plurality of nonvolatile memory cells respectively; and, stopping at least one of the voltages applied to the source, the drain, and the control gate when it is monitored that the current flowing in the channel in the at least one of the plurality of nonvolatile memory cells reaches at least one of a plurality of reference current levels corresponding to a plurality of threshold levels.

32. A programming method using a programming system for a nonvolatile memory, the programming system being capable of selecting a memory cell, and the nonvolatile memory comprising a memory array including two or more memory cells each having a field effect transistor with a control gate, a drain, a source, and charge storage means connected to the control gate, the drain, and the source in static capacitance relations, to determine a threshold voltage of the memory cell according to a charge amount stored in the charge storage means, the method comprising the steps of:

setting voltages linearly proportional to a plurality of threshold voltages;

applying the voltages linearly proportional to a plurality of threshold voltages to one of the control gate, the source, and the drain in at least one selected memory cell and applying fixed voltages appropriate for programming to remaining two of the control gate, the source, and the drain; and, forcibly stopping programming of said at least one selected memory cell when a current flowing in a channel of said at least one selected memory cell reaches a reference current.

33. A programming method using a programming system for a nonvolatile memory, the programming system being capable of selecting a memory cell, and the nonvolatile memory comprising a memory array including a plurality of memory cells each having a field effect transistor with a control gate, a drain, a source, and charge storage means connected to the control gate, the drain, and the source in static capacitance relations, the method comprising the steps of:

setting voltages linearly proportional to a plurality of threshold voltages;

selecting a desired memory cell for programming;

applying at least one of the voltages linearly proportional to a plurality of threshold voltages to the control gate in the desired memory cell; and, forcibly stopping programming of the desired memory cell when it is monitored that the charge storage means in the desired memory cell reaches a charge level pertinent to a threshold voltage corresponding to the voltage applied to the control gate, thereby finishing programming the desired memory cell.

34. A programming method using a programming system for a nonvolatile memory, the programming system being capable of selecting a memory cell, and the nonvolatile memory comprising a memory array including a plurality of memory cells each having a field effect transistor with a control gate, a drain, a source, and a charge storage means connected to the control gate, the drain, and the source in static capacitance relations, the method comprising the steps of:

selecting a desired memory cell for programming;

setting voltages linearly proportional to a plurality of threshold voltages as well as fixed current values flowing in the source and the drain in the desired memory cell pertinent to the plurality of threshold voltages; and, applying the voltages linearly proportional to the plurality of threshold voltages to the control gate in the desired memory cell and forcibly stopping programming of the desired memory cell using the fixed current values, thereby finishing programming the desired memory cell.

35. A programming method using a programming system for a nonvolatile memory, the programming system being capable of selecting a memory cell, and the nonvolatile memory comprising a memory array including a plurality of memory cells each having a field effect transistor with a control gate, a drain, a source, and charge storage means connected to the control gate, the drain, and the source in static capacitance relations, the method comprising the steps of:

selecting a desired memory cell for programming;

setting voltages linearly proportional to a plurality of threshold voltages as well as fixed current values flowing in the source and the drain in the desired memory cell pertinent to the plurality of threshold voltages; and, applying the voltages linearly proportional to the plurality of threshold voltages to the source, the drain, and the control gate in the desired memory cell and forcibly stopping programming of the desired memory cell using the fixed current values, thereby finishing programming the desired memory cell.

36. A programming method using a programming system for a nonvolatile memory, the programming system being capable of selecting a memory cell, and the nonvolatile memory comprising a memory array including a plurality of memory cells each having a field effect transistor with a control gate, a drain, a source, and charge storage means connected to the control gate, the drain, and the source in static capacitance relations, the method comprising the steps of:

setting a plurality of current values flowing in the source and the drain in the memory cells pertinent to a plurality of threshold voltages; and, applying voltages linearly proportional to the plurality of threshold voltages to the source, the drain, and the control gate in selected memory cells of the plurality of memory cells and forcibly stopping programming of each of the selected memory cells using the plurality of current values, thereby programming each of the selected cells.

37. A programming method using a programming system for a nonvolatile memory, the programming system being capable of selecting a memory cell, and the nonvolatile memory comprising a memory array including a plurality of memory cells each having a field effect transistor with a control gate, a drain, a source, and charge storage means connected to the control gate, the drain, and the source in static capacitance relations, the method comprising the steps of:

selecting a desired memory cell out of the plurality of memory cells for programming;

applying voltages pertinent to a particular threshold voltage to the source, the drain, and the control gate in the desired memory cell; and, forcibly stopping programming of the desired memory cell using a reference current pertinent to the particular threshold voltage, thereby finishing programming the desired memory cell.

* * * * *